US012751181B2

(12) United States Patent
Wang et al.

(10) Patent No.: US 12,751,181 B2
(45) Date of Patent: Sep. 29, 2026

(54) FLEXIBLE OLED DISPLAY SUBSTRATE AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Ge Wang, Beijing (CN); Zhiliang Jiang, Beijing (CN); Xiangnan Pan, Beijing (CN); Qing He, Beijing (CN); Xiaomin Yuan, Beijing (CN); Zaiyong Long, Beijing (CN); Qingqing Yan, Beijing (CN); Min Chen, Beijing (CN); Mingfang Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 140 days.

(21) Appl. No.: 18/556,869

(22) PCT Filed: Jan. 3, 2023

(86) PCT No.: PCT/CN2023/070118

§ 371 (c)(1),
(2) Date: Oct. 23, 2023

(87) PCT Pub. No.: WO2023/131119

PCT Pub. Date: Jul. 13, 2023

(65) Prior Publication Data

US 2024/0215396 A1 Jun. 27, 2024

(30) Foreign Application Priority Data

Jan. 4, 2022 (CN) ......................... 202210002044.2
Jan. 4, 2022 (CN) ......................... 202220004951.6

(51) Int. Cl.
*H10K 59/80* (2023.01)
*G06F 3/041* (2006.01)
(Continued)

(52) U.S. Cl.
CPC ........... *H10K 59/873* (2023.02); *H10K 59/40* (2023.02)

(58) Field of Classification Search
CPC ........ H10K 59/40; H10K 50/10; H10K 59/10; H10K 59/873; H10K 50/844; H10K 50/80; H10K 59/00
See application file for complete search history.

(56) References Cited

U.S. PATENT DOCUMENTS 10,743,425 B2 * 8/2020 Park ....................... H05K 13/04
11,409,400 B2 * 8/2022 Lee ...................... H10K 59/879
(Continued)

FOREIGN PATENT DOCUMENTS

CN 106057847 A 10/2016
CN 106531763 A 3/2017
(Continued)

OTHER PUBLICATIONS

PCT/CN2023/070118 international search report.
PCT/CN2023/070118 Written Opinion.

*Primary Examiner* — Sonya McCall-Shepard
(74) *Attorney, Agent, or Firm* — IPro, PLLC

(57) ABSTRACT

A display substrate and a display apparatus are provided. The display substrate is formed with a display region. The display substrate includes a base substrate, a light-emitting layer, an encapsulation layer, a touch control layer, a blocking portion, and a first organic layer. The touch control layer is located at a side, of the encapsulation layer, away from the base substrate. The first organic layer is located at a side, of the touch control layer, away from the base substrate, at least
(Continued)

covers at least a portion of an edge of the encapsulation layer, and is located outside the bending region. The blocking portion is located at at least one side of the display region and is located at a side, away from the display region, of the edge, away from the display region, of the encapsulation layer.

17 Claims, 7 Drawing Sheets

(51) Int. Cl.

| | |
|---|---|
| ***G09F 9/30*** | (2006.01) |
| ***H10K 50/10*** | (2023.01) |
| ***H10K 50/80*** | (2023.01) |
| ***H10K 50/844*** | (2023.01) |
| ***H10K 59/00*** | (2023.01) |
| ***H10K 59/10*** | (2023.01) |
| ***H10K 59/40*** | (2023.01) |

(56) References Cited

U.S. PATENT DOCUMENTS

| | | | |
|---|---|---|---|
| 2016/0204373 | A1 | 7/2016 | Park |
| 2016/0293885 | A1 | 10/2016 | Park et al. |
| 2017/0077456 | A1 | 3/2017 | Chung et al. |
| 2020/0209465 | A1 | 7/2020 | Chen et al. |
| 2021/0359252 | A1 | 11/2021 | Wang et al. |
| 2022/0283657 | A1 | 9/2022 | Cheng et al. |

FOREIGN PATENT DOCUMENTS

| | | | |
|---|---|---|---|
| CN | 206650080 | U | 11/2017 |
| CN | 109725460 | A | 5/2019 |
| CN | 109860411 | A | 6/2019 |
| CN | 112799550 | A | 5/2021 |
| CN | 113377229 | A | 9/2021 |
| CN | 113419641 | A | 9/2021 |
| CN | 216980613 | U | 7/2022 |
| CN | 114975829 | A | 8/2022 |

* cited by examiner

FLEXIBLE OLED DISPLAY SUBSTRATE AND DISPLAY APPARATUS

CROSS-REFERENCE TO RELATED APPLICATIONS

The present disclosure is a U.S. national phase of PCT Application No. PCT/CN2023/070118 filed on Jan. 3, 2023 which claims priority to Chinese patent application No. 202210002044.2 filed on Jan. 4, 2022, and claims priority to Chinese patent application No. 202220004951.6 filed on Jan. 4, 2022 which are hereby incorporated by reference in their entireties.

TECHNICAL FIELD

The present disclosure relates to the field of display technologies and in particular to a display substrate and a display apparatus.

BACKGROUND

In the related arts, flexible Organic Light-Emitting Diode (OLED) display substrates have many advantages, such as foldability, bendability, narrow bezel, and the like. The flexible OLED display substrate is formed of a flexible substrate, a driving circuit, a light-emitting layer, and an encapsulation layer. The flexible encapsulation layer has a sandwich structure: two inorganic layers and an organic layer between the two inorganic layers. The organic layer is produced by printing. The organic layer is in a liquid state at its early stage and forms a slope when flowing to an edge of the display substrate. If the slope enters a display region of the display substrate, the slope will affect a path of light, leading to the defective waviness occurring at an edge of the display region.

SUMMARY

The present disclosure provides a display substrate and a display apparatus, to solve the shortcomings in the related arts.

According to a first aspect of embodiments of the present disclosure, a display substrate is provided. The display substrate is formed with a display region and a non-display region, the non-display region adjoins the display region, and the non-display region includes a bending region;

the display substrate includes:

a base substrate;

a light-emitting layer, located on the base substrate and located in the display region;

an encapsulation layer, located at a side, of the light-emitting layer, away from the base substrate;

a touch control layer, located at a side, of the encapsulation layer, away from the base substrate;

a first organic layer, located at a side, of the touch control layer, away from the base substrate, at least covering at least a portion of an edge of the encapsulation layer, and located outside the bending region;

a blocking portion, located at at least one side of the display region, and located at a side, away from the display region, of the edge, away from the display region, of the encapsulation layer.

In an embodiment, the blocking portion is located at a side, away from the display region, of an edge, away from the display region, of the first organic layer.

In an embodiment, the blocking portion is located outside the bending region and is used to block the first organic layer from entering the bending region.

In an embodiment, a height of the blocking portion is greater than a height of an edge, of the first organic layer, away from the display region.

In an embodiment, the encapsulation layer includes:

an organic encapsulation layer, located at a side, of the light-emitting layer, away from the base substrate, and located in the display region; where the blocking portion is located at a side, away from the display region, of an edge, away from the display region, of the organic encapsulation layer; the organic encapsulation layer includes a slope portion and the slope portion has a non-uniform thickness distribution.

In an embodiment, the first organic layer includes an optical compensation portion, a projection of the slope portion onto the base substrate is located within a projection of the optical compensation portion onto the base substrate, and the optical compensation portion is configured to weaken or eliminate a phenomenon, of waviness occurring in a display image, caused by the slope portion.

In an embodiment, at different positions in the display region, sums of thicknesses of the optical compensation portion and thicknesses of the slope portion are basically same, a refractive index of the slope portion is same as a refractive index of the optical compensation portion, and a surface, of the optical compensation portion, away from the base substrate is parallel to a surface, of the base substrate, facing the light-emitting layer.

In an embodiment, a material of the organic encapsulation layer is same as a material of the optical compensation portion.

In an embodiment, the organic encapsulation layer further includes a first planar portion, located in the display region and adjoining the slope portion; where the first planar portion has a uniform thickness distribution; and the first organic layer further includes a second planar portion, located in the display region and adjoining the optical compensation portion; where the second planar portion is located at a side, of the first planar portion, away from the base substrate; a surface, of the second planar portion, away from the base substrate is parallel to the surface, of the base substrate, facing the light-emitting layer; a material of the second planar portion is same as a material of the optical compensation portion; at different positions in the display region, sums of thicknesses of the first organic layer and thicknesses of the organic encapsulation layer are basically same.

In an embodiment, the first organic layer further includes an edge portion, where the edge portion adjoins the optical compensation portion, the edge portion is located in the non-display region, and located outside the bending region.

In an embodiment, the touch control layer includes a first metal layer, an insulation layer, and a second metal layer; the first metal layer is located at a side, of the organic encapsulation layer, away from the base substrate; the insulation layer is located at a side, of the first metal layer, away from the base substrate and covers the first metal layer; and the second metal layer is located at a side, of the insulation layer, away from the base substrate.

In an embodiment, the display substrate further includes:

a second organic layer, located between the touch control layer and the first organic layer, located in the display region and the non-display region, and located outside the bending region; where the second organic layer covers the second metal layer.

In an embodiment, the blocking portion is located in at least one of the first metal layer, the insulation layer, the second metal layer, and the second organic layer.

In an embodiment, when the blocking portion is located in another layer other than the second metal layer in the first metal layer, the insulation layer, the second metal layer, and the second organic layer, the second metal layer includes a hollowed-out portion, a lapping portion, and a wiring portion; the lapping portion is located at a side, of the hollowed-out portion, away from the display region; the wiring portion is located at a side, of the lapping portion, away from the display region; a projection of the blocking portion onto the base substrate is located within a projection of the hollowed-out portion onto the base substrate; the lapping portion is lapped with the first metal layer; and the wiring portion is connected to the lapping portion.

In an embodiment, there are N blocking portions, where N is a positive integer; when N is greater than 1, the N blocking portions are sequentially arranged along a direction pointing from the display region to the non-display region.

In an embodiment, when N is greater than 1, there is a gap between two adjacent blocking portions.

In an embodiment, when N is greater than 1, the N blocking portions have a same height, or, when N is greater than 1, at least two of the N blocking portions have different heights.

In an embodiment, a distance between the blocking portion and the bending region is less than a distance between the blocking portion and the display region.

In an embodiment, the display substrate further includes a dam, where the dam is located in the non-display region, the dam is located at a side, of the blocking portion, close to the display region, and the dam is not overlapped with the blocking portion along a direction perpendicular to the base substrate; and a distance between the blocking portion and the dam is less than a distance between the blocking portion and the bending region.

According to a second aspect of embodiments of the present disclosure, a display apparatus is provided, including the above display substrate.

According to the display substrate and the display apparatus provided by the embodiments of the present disclosure, since the first organic layer is located at a side, of the touch control layer, away from the base substrate and the first organic layer at least covers at least a portion of an edge of the encapsulation layer, a difference between a total thickness of the first organic layer and the encapsulation layer located at an edge portion of the display region and a total thickness of the display region portion may be small, and thus the display effect of the edge portion of the display region may be improved and the display quality of the display substrate is improved. Since the blocking portion located at at least one side of the display region is located at a side, away from the display region, of the edge, away from the display region, of the encapsulation layer, the blocking portion may block an organic layer of the encapsulation layer and the first organic layer from overflowing out of the display region, helping reduce the difference between the total thickness of the first organic layer and the encapsulation layer located at the edge portion of the display region and the total thickness of the display region portion, and further helping improve the display quality.

It needs to be understood that the above general descriptions and subsequent detailed descriptions are merely exemplary and explanatory, rather than limiting of the present disclosure.

DETAILED DESCRIPTION

Figure 1:
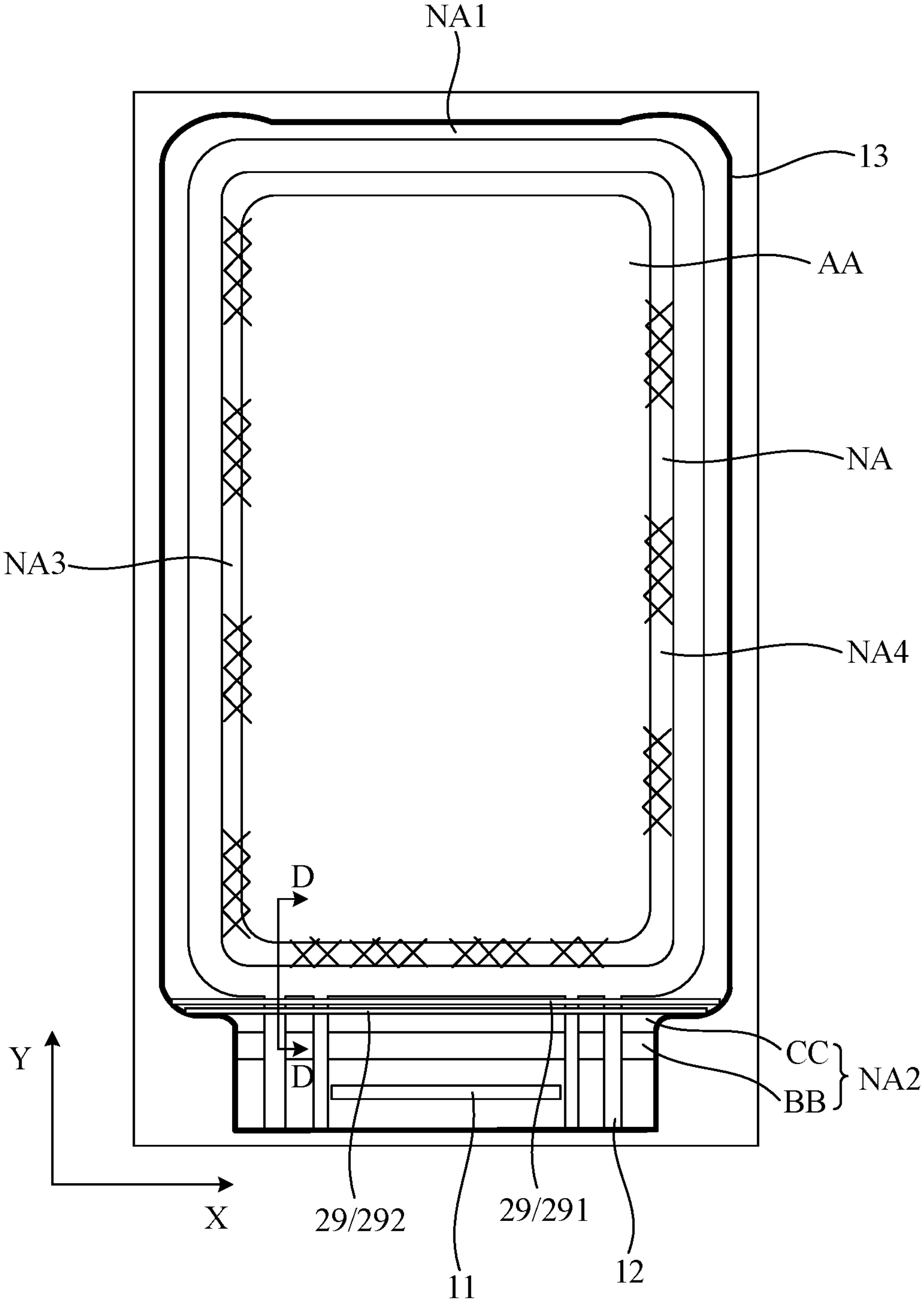
FIG. 1 is a top view illustrating a display substrate according to an embodiment of the present disclosure.

Exemplary embodiments will be described in details herein, with the examples thereof represented in the drawings. When the following descriptions involve the drawings, like numerals in different drawings refer to like or similar elements unless otherwise indicated. The embodiments described in the following exemplary embodiments do not represent all embodiments consistent with the present disclosure. Rather, they are merely examples of apparatuses and methods consistent with some aspects of the present disclosure as detailed in the appended claims.

Figure 2A:
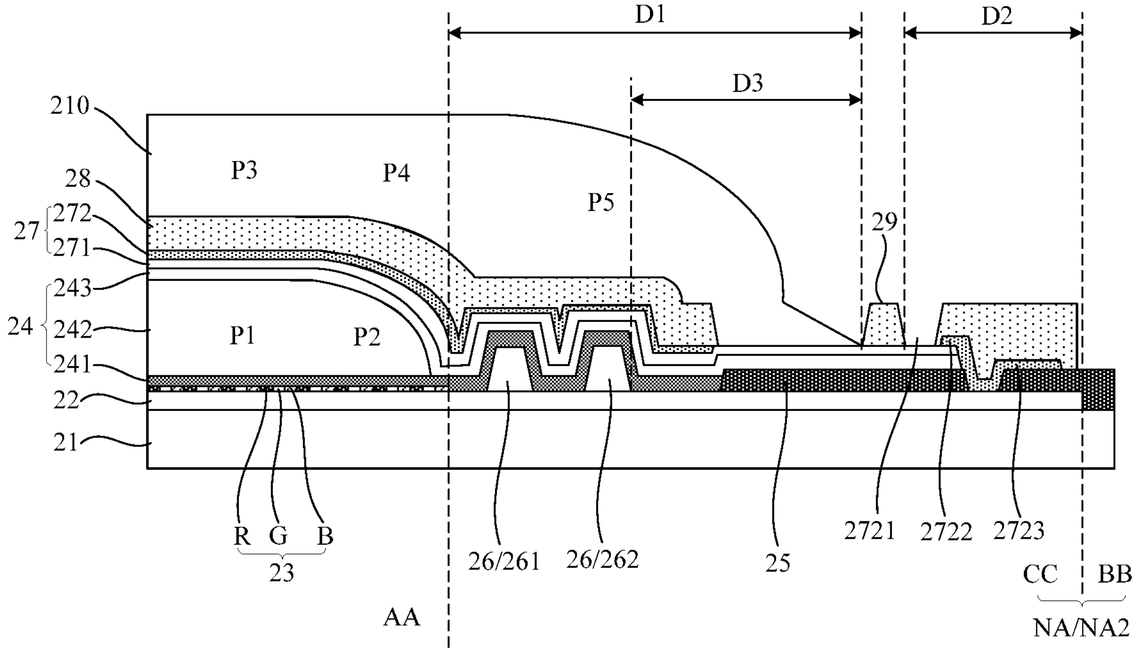
FIG. 2A is a sectional view taken along a sectional line DD in FIG. 1.

Embodiments of the present disclosure provide a display substrate. As shown in FIGS. 1 to 2A, the display substrate is formed with a display region AA and a non-display region NA, where the non-display region NA adjoins the display region AA. The non-display region includes a bending region BB. The display substrate includes a base substrate 21, a light-emitting layer 23, an encapsulation layer 24, a touch control layer 27, a first organic layer 210, and a blocking portion 29. FIG. 2A is a sectional view taken along a sectional line DD in FIG. 1.

As shown in FIGS. 1 to 2A, the light-emitting layer 23 is located on the base substrate 21 and located in the display region AA. The encapsulation layer 24 is located at a side, of the light-emitting layer 23, away from the base substrate 21. The touch control layer 27 is located at a side, of the encapsulation layer 24, away from the base substrate 21. The first organic layer 210 is located at a side, of the touch control layer 27, away from the base substrate 21. The first organic layer 210 at least covers at least a portion of an edge of the encapsulation layer 24 and is located outside the bending region BB. The blocking portion 29 is located at at least one side of the display region AA, and the blocking portion 29 is located at a side, away from the display region AA, of an edge, away from the display region AA, of the encapsulation layer 24.

In this embodiment, since the first organic layer is located at a side, of the touch control layer, away from the base substrate and the first organic layer at least covers at least a portion of an edge of the encapsulation layer, a difference between a total thickness of the first organic layer and the encapsulation layer located at an edge portion of the display region and a total thickness of the display region portion may be small, and thus the display effect of the edge portion of the display region may be improved and the display quality of the display substrate is improved. Since the blocking portion located at at least one side of the display region is located at a side, away from the display region, of the edge, away from the display region, of the encapsulation layer, the blocking portion may block an organic layer of the encapsulation layer and the first organic layer from overflowing out of the display region, helping reduce the difference between the total thickness of the first organic layer and the encapsulation layer located at the edge portion of the display region and the total thickness of the display region portion, and further helping improve the display quality.

The first organic layer includes an optical compensation portion, and a projection of the slope portion onto the base substrate is located within a projection of the optical compensation portion onto the base substrate. The optical compensation portion is configured to weaken or eliminate the phenomenon, of the waviness occurring in a display image, caused by the slope portion. Therefore, when the light-emitting layer emits light, the phenomenon of the waviness occurring in the display image may be weakened or eliminated, so as to improve the display quality. Brief descriptions have been made to the display substrate provided by the embodiments of the present disclosure as above, and detailed descriptions will be made below to the display substrate provided by the embodiments of the present disclosure.

Embodiments of the present disclosure further provide a display substrate. As shown in FIG. 1, the display substrate includes a display region AA and a non-display region NA. The display region AA adjoins the non-display region NA.

In some embodiments, as shown in FIG. 1, the non-display region AA surrounds the display region AA. In other embodiments, the non-display region NA may partially surround the display region AA. For example, the non-display region NA may surround the display region AA on two or three sides.

In some embodiments, as shown in FIG. 1, the non-display region NA includes an upper bezel region NA1, a lower bezel region NA2, a left bezel region NA3, and a right bezel region NA4. The lower bezel region NA2 is located at a side, of the display substrate, that is provided with a driving chip 11. The left bezel region NA3 and the right bezel region NA4 are located at two sides of the display substrate and are opposed in position to each other along a first direction X. The upper bezel region NA1 and the lower bezel region NA2 are also located at two sides of the display substrate and are opposed in position to each other along a second direction Y.

In some embodiments, as shown in FIG. 1, the lower bezel region NA2 includes a fan-out region CC and a bending region BB. The fan-out region CC is located between the display region AA and the bending region BB. Multiple signal lines are disposed in the fan-out region CC, such as a data signal line (not shown), a touch control signal line 12, and a power supply signal line (not shown), but not limited to this. The driving chip 11 is located at a side, of the bending region BB, away from the display region AA. The bending region BB can achieve bending, to dispose the driving chip 11 at a side, of the display substrate, facing away from the light-emitting layer.

In some embodiments, as shown in FIG. 1, a scribe line 13 and the blocking portion 29 are disposed on the display substrate, and the scribe line 13 and the blocking portion 29 are located in the non-display region NA. The scribe line 13 is used to indicate a cutting path.

In some embodiments, the blocking portion 29 is located at a side, away from the display region AA, of the edge of the first organic layer 210 away from the display region AA. With this disposal, the blocking portion 29 may block the organic material of the first organic layer 210 from overflowing along a direction away from the display region.

In an embodiment, a height of the blocking portion 29 is greater than a height of an edge, of the first organic layer 210, away from the display region AA. This disposal more helps the blocking portion 29 to block the organic material of the first organic layer 210 from overflowing along the direction away from the display region.

In some embodiments, the blocking portion 29 is located outside the bending region BB and is used to block the first organic layer 210 from entering the bending region BB. With this disposal, the blocking portion 29 may prevent the first organic layer 210 from entering the bending region BB and thus prevent a thickness of film layers in the bending region BB from increasing, to hence avoid the problem, of cracks generated in the film layer in the bending region BB or wire breakage in the bending region BB during bending of the bending region BB.

In some embodiments, as shown in FIG. 1, the blocking portion 29 is only located in the lower bezel region NA2 and the blocking portion 29 is not disposed in the other bezel regions. Further, a structure formed by the organic material at the edge of the scribe line does not have a slope portion; or, at least major part of the slope portion is cut off by process adjustment, such that the remaining structure basically does not have the slope portion.

Figure 2B:
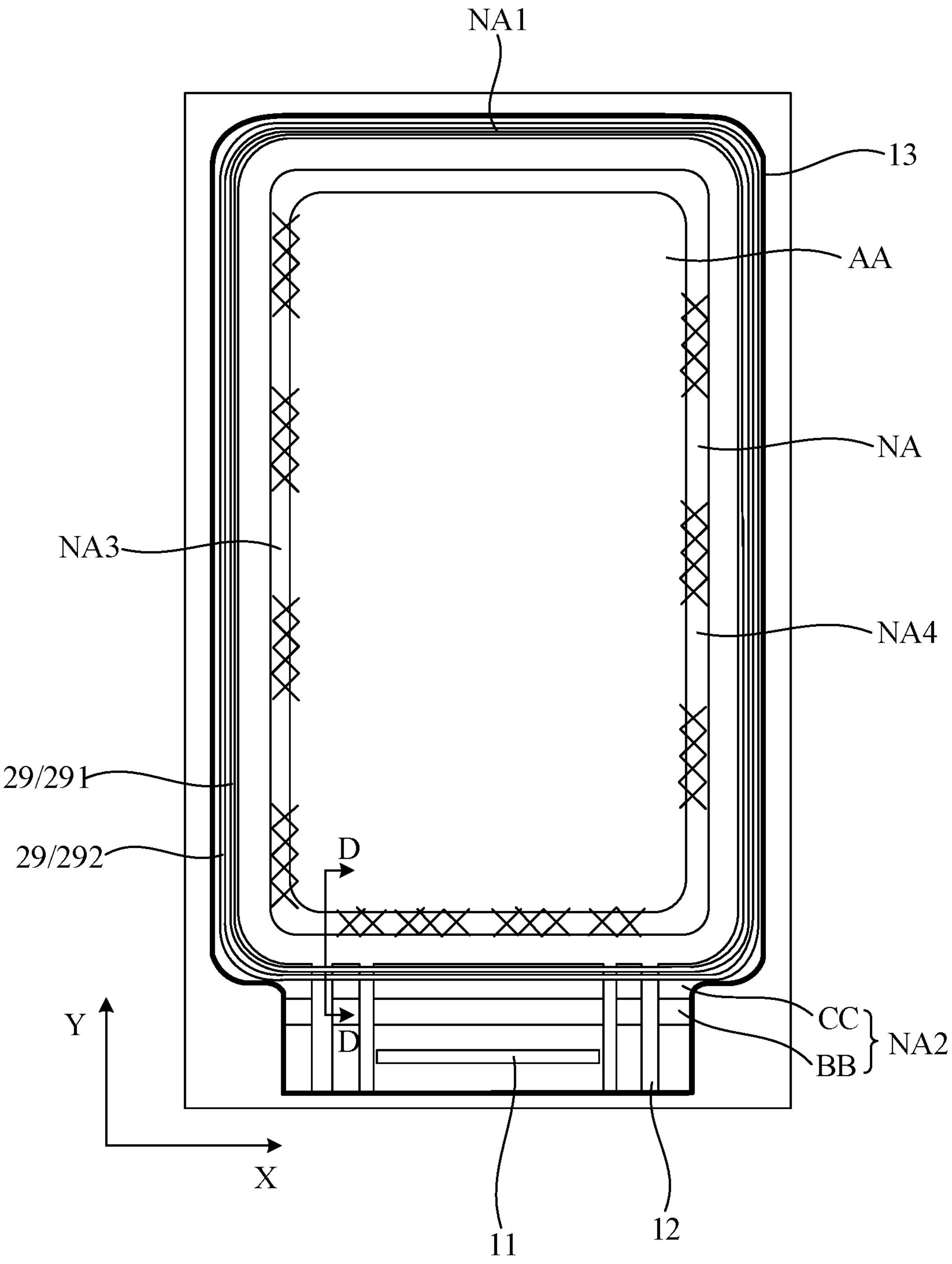
FIG. 2B is a top view illustrating another display substrate according to an embodiment of the present disclosure.

In some other embodiments, the blocking portion 29 is not only disposed in the lower bezel region NA2, but may also exist in at least one of the other bezel regions to block the first organic layer from overflowing. As shown in FIG. 2B, the structure of the blocking portion 29 may be at least one circle of structure at least partially surrounding the display region AA. The blocking portion 29 includes at least one organic layer. In the embodiment shown in FIG. 2B, the display substrate includes a first blocking portion 291 and a second blocking portion 292 at a side, of the first blocking portion 291, away from the display region AA. Both the first blocking portion 291 and the second blocking portion 292 surround the display region AA. In other embodiments, the display substrate may include three or more blocking portions 29 surrounding the display region AA.

Figure 2C:
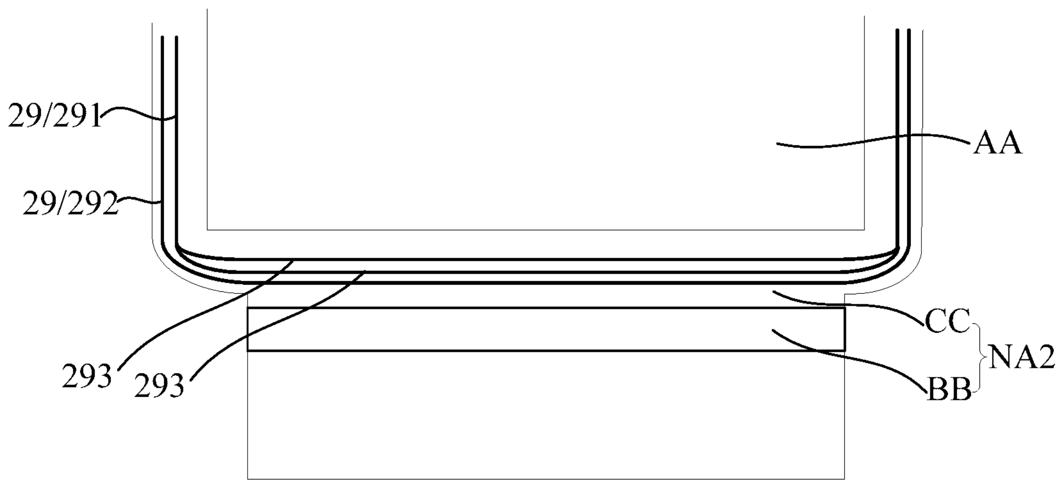
FIG. 2C is a top view illustrating a partial structure of still another display substrate according to an embodiment of the present disclosure.

In some embodiments, as shown in FIG. 2C, a part, close to the lower bezel region NA2, of at least one blocking portion 29 of the display substrate is forked into two sub-blocking portions 293 and the left and right sides of the blocking portion may be basically symmetrical. In this case, at least one blocking portion 29 forms two sub-blocking portions 293 between the display region AA and the bending region BB, which helps more to block the first organic layer 210 from entering the bending region BB. When the display substrate includes two or more blocking portions 29, a part, close to the lower bezel region NA2, of the blocking portion 29 close to the display region AA may be forked into two sub-blocking portions. In the embodiment shown in FIG. 2C, the display substrate includes a first blocking portion 291 and a second blocking portion 292, where the second blocking portion 292 is located at a side, of the first blocking portion 291, away from the display region AA. A part, close to the lower bezel region NA2, of the first blocking portion 291 is forked into two sub-blocking portions 293.

Figure 2D:
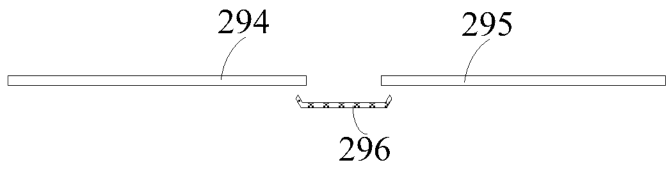
FIG. 2D is a top view illustrating a partial structure of yet another display substrate according to an embodiment of the present disclosure.

In some embodiments, the blocking portion 29 is discontinued in the bezel regions, namely, a notch is disposed at some positions, of the blocking portion 29, in the bezel regions. As shown in FIG. 2D, the blocking portion 29 includes a first blocking segment 294 and a second blocking segment 295. The first blocking segment 294 and the second blocking segment 295 are spaced apart from each other and a notch is formed between the first blocking segment 294 and the second blocking segment 295. The display substrate further includes a buffer portion 296 located at a side, of the first blocking segment 294, away from the display region AA. The notch between the first blocking segment 294 and the second blocking segment 295 is opposed to the buffer portion 296. When the organic material flows out through the notch between the first blocking segment 294 and the second blocking segment 295, the organic material has a high speed. After the organic material flows out from the notch, the organic material bypasses the buffer portion 296 and flows out from both sides of the buffer portion 296. Therefore, the buffer portion 296 may lower the speed at which the organic material overflows. FIG. 2D only schematically shows a partial structure of the blocking portion 29. Notches may be formed at multiple positions of the blocking portion 29 and a buffer portion may be disposed at a side, of each notch, away from the display region AA respectively.

Furthermore, as shown in FIG. 2D, two ends of the buffer portion 296 bend in the direction towards the display region AA to further lower the speed at which the organic material overflows. A length of the buffer portion 296 may be greater than a size of the notch between the first blocking segment 294 and the second blocking segment 295, so as to more effectively lower the speed at which the organic material overflows. The buffer portion 296 may be in the shape of wave, straight line, folding line, arc, or the like.

In an embodiment, the encapsulation layer 24 includes an organic encapsulation layer 242. The organic encapsulation layer 242 is located at a side, of the light-emitting layer 23, away from the base substrate 21, and the organic encapsulation layer 242 is located in the display region AA. The blocking portion 29 is located at a side, away from the display region AA, of an edge, away from the display region AA, of the organic encapsulation layer 242. The organic encapsulation layer 242 includes a slope portion P2, and the slope portion P2 has a non-uniform thickness distribution.

Furthermore, the first organic layer 210 includes an optical compensation portion P4, and an orthographic projection of the slope portion P2 onto the base substrate 21 is located within an orthographic projection of the optical compensation portion P4 onto the base substrate 21. The optical compensation portion P4 is configured to weaken or eliminate the phenomenon, of the waviness occurring in a display image, caused by the slope portion. Therefore, when the light-emitting layer 23 emits light, the optical compensation portion P4 may weaken or eliminate the phenomenon of the waviness occurring in the display image, to improve the display quality.

In some embodiments, as shown in FIG. 2A, the display substrate includes a base substrate 21, a driving circuit layer 22, a light-emitting layer 23, an encapsulation layer 24, a planarization layer 25, a dam 26, a touch control layer 27, a second organic layer 28, a blocking portion 29, and a first organic layer 210. FIG. 2A is a sectional view taken along a sectional line DD in FIG. 1.

In some embodiments, the base substrate 21 is a flexible base substrate. A material of the base substrate 21 includes a polymer material resistant to acid and alkali, for example, the material of the base substrate 21 includes at least one of polyimide, polyethylene, polypropylene, polystyrene, and polyethylene glycol terephthalate.

In some embodiments, as shown in FIG. 2A, the driving circuit layer 22 is located on the base substrate 21, and a pixel circuit for sub-pixels is disposed in the driving circuit layer 22, where the pixel circuit is used to drive the sub-pixels to emit light. The pixel circuit includes a transistor, and the pixel circuit may also include a capacitor. For example, the pixel circuit may be a 1T pixel circuit, a 2T1C pixel circuit, a 3T1C pixel circuit, a 4T1C pixel circuit, a 5T1C pixel circuit, a 6T1C pixel circuit, or a 7T1C pixel circuit.

In some embodiments, as shown in FIG. 2A, the light-emitting layer 23 is located at a side, of the driving circuit layer 22, away from the base substrate 21. The light-emitting layer 23 may include a red sub-pixel R, a green sub-pixel G, and a blue sub-pixel B, but not limited to this. The red sub-pixel R is used to emit red light, the green sub-pixel G is used to emit green light, and the blue sub-pixel B is used to emit blue light.

In some embodiments, the light-emitting layer 23 is an organic light-emitting layer. The red sub-pixel R, the green sub-pixel G, and the blue sub-pixel B are all OLED (Organic Light-Emitting Diode) sub-pixels.

In some embodiments, as shown in FIG. 2A, the encapsulation layer 24 is located at a side, of the light-emitting layer 23, away from the base substrate 21, and is used to block water and oxygen from eroding the light-emitting layer 23. The encapsulation layer 24 includes a first inorganic encapsulation layer 241, an organic encapsulation layer 242, and a second inorganic encapsulation layer 243. The first inorganic encapsulation layer 241 is located at a side, of the light-emitting layer 23, away from the base substrate 21, the organic encapsulation layer 242 is located at a side, of the first inorganic encapsulation layer 241, away from the base substrate 21, and the second inorganic encapsulation layer 243 is located at a side, of the organic encapsulation layer 242, away from the base substrate 21. The organic encapsulation layer 242 may be formed by an ink-jet printing (IP) process.

In some embodiments, as shown in FIG. 2A, one part of the first inorganic encapsulation layer 241 and one part of the second inorganic encapsulation layer 243 are located in the display region AA, and the other part of the first inorganic encapsulation layer 241 and the other part of the second inorganic encapsulation layer 243 are located in the non-display region NA. The organic encapsulation layer 242 is located in the display region AA.

In some embodiments, as shown in FIG. 2A, the organic encapsulation layer 242 includes a first planar portion P1 and a slope portion P2. Both the first planar portion P1 and the slope portion P2 are located in the display region AA. The first planar portion P1 adjoins the slope portion P2, and the slope portion P2 surrounds the first planar portion P1, namely, the first planar portion P1 is located within the slope portion P2. The first planar portion P1 has a uniform thickness distribution and the slope portion P2 has a non-uniform thickness distribution. For example, along a direction pointing from the first planar portion P1 to the slope portion P2, the thickness of the slope portion P2 decreases gradually. The wedge-like structure of the slope portion P2 will cause an interference phenomenon, and the organic encapsulation layer 242 will cause the phenomenon of the waviness occurring at the edge of the display image due to presence of the slope portion P2 around the organic encapsulation layer 242.

In some embodiments, as shown in FIG. 2A, the planarization layer 25 is located at a side, of the driving circuit layer 22, away from the base substrate 21. The planarization layer 25 is located in the non-display region NA and is located between the driving circuit layer 22 and the touch control layer 27 to separate the driving circuit layer 22 from the touch control layer 27. A material of the planarization layer 25 is an organic insulation material.

In some embodiments, as shown in FIG. 2A, the dam 26 is located at a side, of the driving circuit layer 22, away from the base substrate 21. The dam 26 is located in the non-display region NA and is located at a side, of the blocking portion 29, close to the display region AA. The dam 26 is used to block the organic material for preparing the organic encapsulation layer 242 from overflowing to the non-display region NA when preparing the organic encapsulation layer 242.

In some embodiments, as shown in FIG. 2A, the dam 26 may be ring-shaped. There may be two dams 26, for example, the display substrate may include a first dam 261 and a second dam 262 and the first dam 261 is located at an inner side of the second dam 262. Thus, when the organic encapsulation layer 242 is prepared, the organic material may be further blocked from overflowing to the non-display region NA, thereby improving the reliability.

In some embodiments, the dam 26 is located at a side, of the blocking portion 29, close to the display region AA, and the dam 26 is not overlapped with the blocking portion 29 along a direction perpendicular to the base substrate 21. A distance between the blocking portion 29 and the dam 26 is less than a distance between the blocking portion 29 and the bending region BB.

Figure 2E:
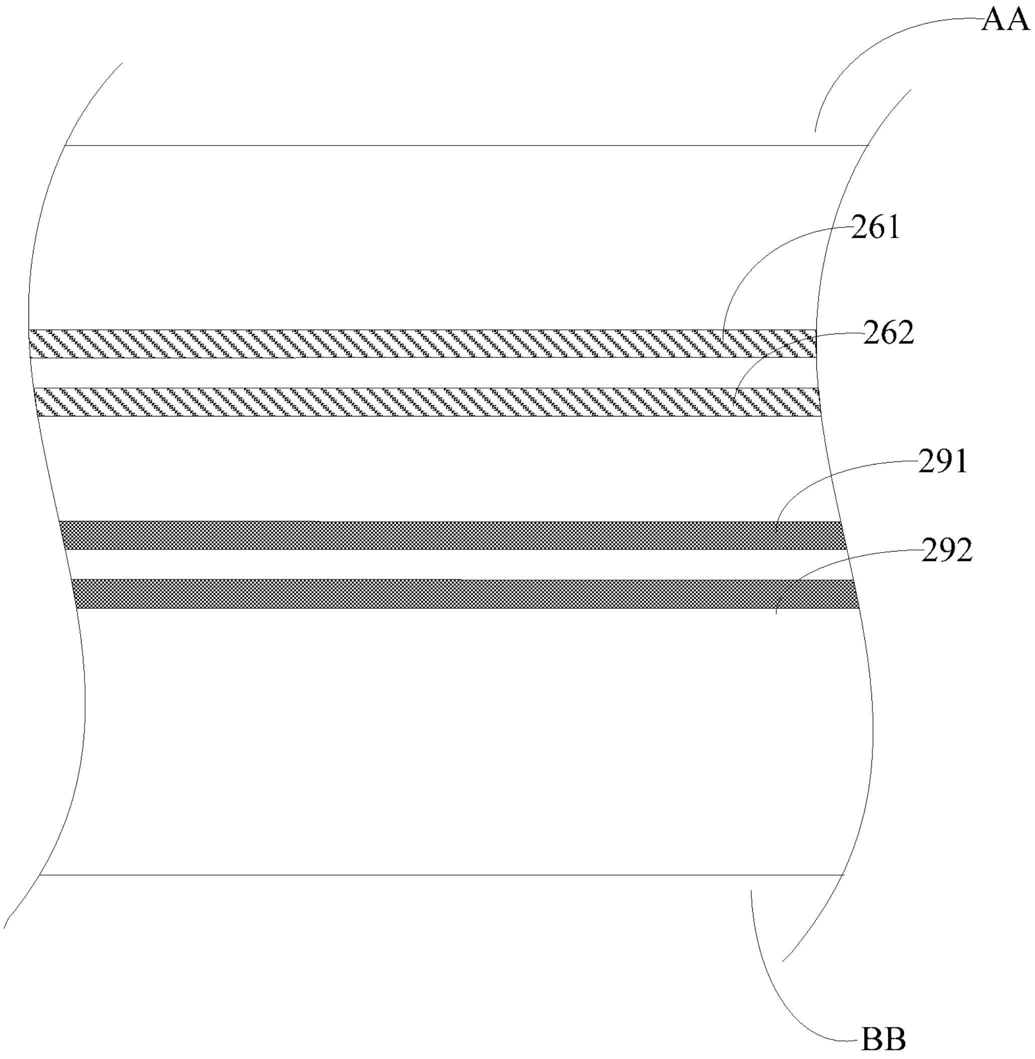
FIG. 2E is a top view illustrating a partial structure of yet another display substrate according to an embodiment of the present disclosure.

In some embodiments, as shown in FIG. 2E, the display substrate may include a first dam 261 and a second dam 262, and the first dam 261 is located at an inner side of the second dam 262; the display substrate includes a first blocking portion 291 and a second blocking portion 292, and the first blocking portion 291 is located at an inner side of the second blocking portion 292.

The width of the first blocking portion 291 may be substantially same as the width of the second blocking portion 292. A distance between the first blocking portion 291 and the second dam 262 is less than a distance between the second blocking portion 292 and the bending portion BB. A distance between the first dam 261 and the display region AA is less than a distance between the second blocking portion 292 and the bending portion BB. A distance between the second dam 262 and the first blocking portion 291 is less than a distance between the first dam 261 and the display region AA.

In some embodiments, as shown in FIG. 2A, the dam 26 and the planarization layer 25 may be located in a same layer, and the material of the dam 26 may be the same as the material of the planarization layer 25, but not limited to this.

In some embodiments, as shown in FIG. 2A, the touch control layer 27 is located at a side, of the encapsulation layer 24, away from the base substrate 21. The touch control layer 27 is located in both the display region AA and the non-display region NA. The touch control layer 27 includes a touch control electrode and a touch control signal line 12. The touch control electrode is located in the display region AA; one part of the touch control signal line 12 is located in the display region AA and the other part of the touch control signal line 12 is located in the non-display region NA.

In some embodiments, the touch control layer 27 may be prepared by a Flexible Multiple Layer on Cell (abbreviated as FMLOC) technology.

In some embodiments, as shown in FIG. 2A, the touch control layer 27 includes a first metal layer 271, an insulation layer (not shown), and a second metal layer 272. The first metal layer 271 is located at a side, of the encapsulation layer 24, away from the base substrate 21, the insulation layer is located at a side, of the first metal layer 271, away from the base substrate 21 and covers the first metal layer 271, and the second metal layer 272 is located at a side, of the insulation layer, away from the base substrate 21.

In some embodiments, as shown in FIG. 2A, wiring may be performed through one of the first metal layer 271 and the second metal layer 272 in a partial region of the fan-out region CC. For example, at a side close to the display region AA, the wiring is performed through the first metal layer 271, and then at a side close to the bending region BB, the wiring is performed through the second metal layer 272. The second metal layer 272 may be connected to the first metal layer 271 through a lapping manner.

In some embodiments, as shown in FIG. 2A, the second metal layer 272 includes a hollowed-out portion 2721, a lapping portion 2722, and a wiring portion 2723. The lapping portion 2722 is located at a side, of the hollowed-out portion 2721, away from the display region AA, and the wiring portion 2723 is located at a side, of the lapping portion 2722, away from the display region AA. The lapping portion 2722 is lapped with the first metal layer 271 and the wiring portion is connected to the lapping portion, namely, the second metal layer 272 is lapped with the first metal layer 271 through the lapping portion 2722.

In some embodiments, as shown in FIG. 2A, the second organic layer 28 is located at a side, of the touch control layer 27, away from the base substrate 21, and the second organic layer 28 is located in the display region AA and the non-display region NA and is located outside the bending region BB. The second organic layer 28 covers the second metal layer 272 to protect the second metal layer 272. The second organic layer 28 also achieves the effect of planarization.

In some embodiments, as shown in FIG. 2A, the first organic layer 210 is located at a side, of the second organic layer 28, away from the base substrate 21. The first organic layer 210 may be formed by an ink-jet printing (IJP) process. The first organic layer 210 includes a second planar portion P3, an optical compensation portion P4, and an edge portion P5. The second planar portion P3 and the optical compensation portion P4 are located in the display region AA, and the second planar portion P3 adjoins the optical compensation portion P4. The optical compensation portion P4 surrounds the second planar portion P3. The edge portion P5 is located in the non-display region NA, the edge portion P5 adjoins the optical compensation portion P4, and the edge portion P5 surrounds the optical compensation portion P4.

In some embodiments, as shown in FIG. 2A, the second planar portion P3 is located at a side, of the first planar portion P1, away from the base substrate 21. A surface, of the second planar portion P3, away from the base substrate 21 is parallel to a surface, of the base substrate 21, facing the light-emitting layer 23. A material of the second planar portion P3 is same as a material of the optical compensation portion P4.

In some embodiments, as shown in FIG. 2A, a projection of the slope portion P2 onto the base substrate 21 is located within a projection of the optical compensation portion P4 onto the base substrate 21, and the optical compensation portion P4 is configured to weaken or eliminate the phenomenon, of the waviness occurring in the display image, caused by the slope portion P2.

In some embodiments, as shown in FIG. 2A, at different positions in the display region AA, suns of the thicknesses of the optical compensation portion P4 and the thicknesses of the slope portion P2 are basically same, and a refractive index of the slope portion P2 is basically same as a refractive index of the optical compensation portion P4. In this case, when the light-emitting layer 23 emits light, at different positions in the display region, the light paths of the exit light exited from the optical compensation portion P4 are basically same, which may weaken or eliminate the phenomenon of the waviness occurring in the display image, thereby improving the display quality.

In some embodiments, as shown in FIG. 2A, a surface, of the optical compensation portion P4, away from the base substrate 21 is parallel to a surface, of the base substrate 21, facing the light-emitting layer 23. The surface, of the optical compensation portion P4, away from the base substrate 21 and the surface, of the second planar portion P3, away from the base substrate 21 are located in a same plane.

In some embodiments, at different positions in the display region AA, sums of the thicknesses of the first organic layer 210 and the thicknesses of the organic encapsulation layer 242 are basically same. The material of the organic encapsulation layer 242 is same as the material of the optical compensation portion P4. Thus, when the light-emitting layer 23 emits light, at different positions in the display region, the light paths of the exit light exited from the first organic layer 210 are basically same, which may weaken or eliminate the phenomenon of the waviness occurring in the display image, thereby improving the display quality.

In some embodiments, as shown in FIG. 2A, the edge portion P5 adjoins the optical compensation portion P4 and the edge portion P5 may surrounds the optical compensation portion P4. The edge portion P5 is located in the non-display region NA. For example, the edge portion P5 may be located in the upper bezel region NA1, the lower bezel region NA2, the left bezel region NA3, and the right bezel region NA4. The edge portion P5 may have a non-uniform thickness.

It needs to be noted that in some embodiments, the first organic layer 210 may only be provided with the optical compensation portion P4 and the edge portion P5, but without the second planar portion P3.

In some embodiments, as shown in FIG. 2A, when the edge portion P5 is located in the lower bezel region NA2, the edge portion P5 is located outside the bending region BB. In this way, the first organic layer 210 may be prevented from affecting the bending performance, of the display substrate, at the bending region BB, thus avoiding the defective phenomena, such as bending crack, damage bending, or the like.

In some embodiments, as shown in FIG. 2A, the blocking portion 29 is located in the non-display region NA and is located outside the bending region BB. The blocking portion 29 is located at a side, of the first organic layer 210, away from the display region AA. The height of the blocking portion 29 is greater than the height of the edge, of the first organic layer 210, away from the display region AA. The blocking portion 29 is used to block the first organic layer 210 from entering the bending region BB.

In some embodiments, as shown in FIG. 2A, when the bending region BB is disposed only in the lower bezel region NA2 while no bending region BB is disposed in the upper bezel region NA1, the left bezel region NA3, and the right bezel region NA4, the blocking portion 29 may be disposed only in the lower bezel region NA2.

In some embodiments, as shown in FIG. 2A, the blocking portion 29 is located in the second organic layer 28. In other embodiments, the blocking portion 29 may also be located in the first metal layer 271, the insulation layer, or the second metal layer 272, or the blocking portion 29 may also be located in at least two of the first metal layer 271, the insulation layer, the second metal layer 272, and the second organic layer 28.

In some embodiments, as shown in FIG. 2A, a projection of the blocking portion 29 onto the base substrate 21 is located within a projection of the hollowed-out portion 2721 onto the base substrate 21. Wiring is performed through the first metal layer 271 rather than the second metal layer 272 in the region at both sides of the blocking portion 29, which may avoid the exposure of the second metal layer 272.

In some embodiments, as shown in FIG. 2A, the distance D2 between the blocking portion 29 and the bending region BB is less than the distance D1 between the blocking portion 29 and the display region AA. In other words, the blocking portion 29 is closer to the bending region BB. In this way, the height of the blocking portion 29 may be lowered.

In some embodiments, as shown in FIG. 2A, the distance D1 between the blocking portion 29 and the display region AA is 500 microns to 1500 microns, for example, the distance D1 between the blocking portion 29 and the display region AA is 500 microns, 900 microns, 1000 microns, or 1500 microns, but not limited to this.

In some embodiments, as shown in FIG. 2A, the distance D2 between the blocking portion 29 and the bending region BB is 400 microns to 1000 microns, for example, the distance D2 between the blocking portion 29 and the bending region BB is 400 microns, 700 microns, 800 microns, or 1000 microns, but not limited to this.

In some embodiments, as shown in FIG. 2A, the distance D3 between the blocking portion 29 and the dam 26 is greater than 50 microns. When there is more than one dam 26, the distance D3 between the blocking portion 29 and the dam 26 is the distance D3 between the blocking portion 29 and the outermost dam 26.

In some embodiments, as shown in FIG. 2A, there is one blocking portion 29. In other embodiments, there are two or more blocking portions 29.

Figure 3:
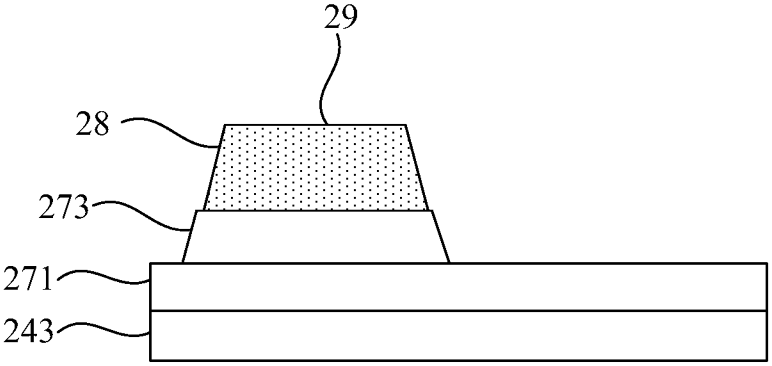
FIG. 3 is a sectional view illustrating another display substrate according to an embodiment of the present disclosure.

Embodiments of the present disclosure further provide a display substrate. The difference from the above embodiment is that, as shown in FIG. 3, in some embodiments, the blocking portion 29 is located in the second organic layer 28 and the insulation layer 273 in the touch control layer 27.

Figure 4:
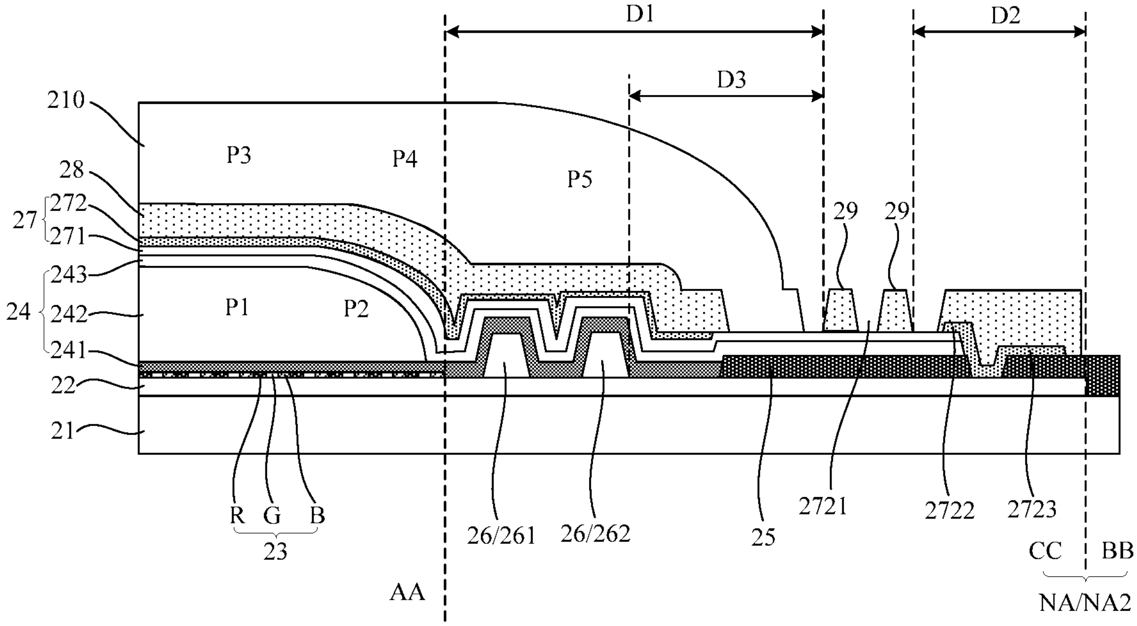
FIG. 4 is a sectional view illustrating another display substrate according to an embodiment of the present disclosure.

An embodiment of the present disclosure further provides a display substrate. The difference from the above embodiment is that, as shown in FIG. 4, in some embodiments, there are two blocking portions 29. The two blocking portions 29 are sequentially arranged along a direction pointing from the display region AA to the bending region BB. In this way, when the material for preparing the first organic layer 210 overflows from the blocking portion 29 close to the display region AA, the blocking portion 29 close to the bending region BB may also block the material for preparing the first organic layer 210 from entering the bending region BB, thereby improving the reliability of the blocking portions.

In some embodiments, as shown in FIG. 4, all the blocking portions 29 have the same height. Thus, the complexity of the preparation process may be diminished, which helps to reduce the costs. In other embodiments, at least two blocking portions of all the blocking portions 29 have different heights.

In some embodiments, as shown in FIG. 4, there is a gap between two adjacent blocking portions 29. In this way, when the material for preparing the first organic layer 210 overflows from the blocking portion 29 close to the display region AA, the blocking portion 29 close to the bending region BB may also block the material for preparing the first organic layer 210 from entering the bending region BB, thereby improving the reliability of the blocking portions.

In some embodiments, as shown in FIG. 4, the two blocking portions 29 may both be located in the second organic layer 28.

Figure 5:
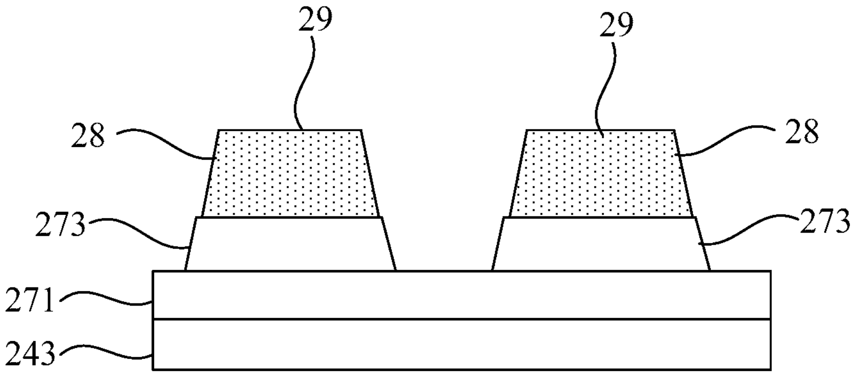
FIG. 5 is a sectional view illustrating another display substrate according to an embodiment of the present disclosure.

In some embodiments, as shown in FIG. 5, each of the two blocking portions 29 is located in the second organic layer 28 and the insulation layer 273 in the touch control layer 27, and the two blocking portions 29 have the same height.

Figure 6:
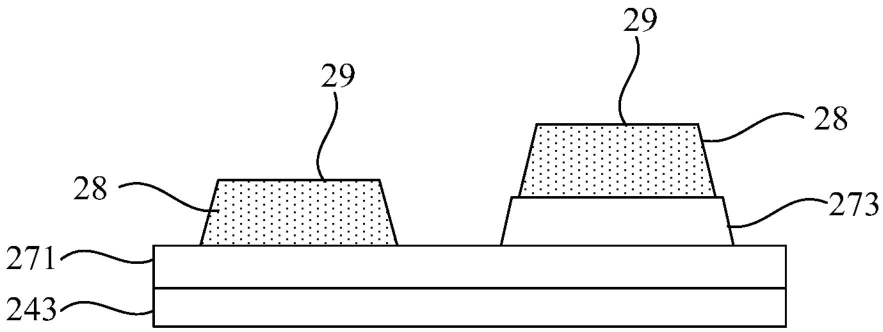
FIG. 6 is a sectional view illustrating another display substrate according to an embodiment of the present disclosure.

In some embodiments, as shown in FIG. 6, there are two blocking portions 29, and the height of the blocking portion 29 close to the display region AA is smaller than the height of the blocking portion 29 close to the bending region BB. In other embodiments, the height of the blocking portion 29 close to the display region AA may be larger than the height of the blocking portion 29 close to the bending region BB.

An embodiment of the present disclosure further provides a display apparatus that includes a display module and the display panel mentioned in any one of the above embodiments.

In this embodiment, the organic encapsulation layer is located at a side, of the light-emitting layer, away from the base substrate, and the organic encapsulation layer is located in the display region; the organic encapsulation layer includes a slope portion, and the slope portion has a non-uniform thickness distribution; further, the first organic layer is located at a side, of the organic encapsulation layer, away from the base substrate and the first organic layer includes an optical compensation portion; a projection of the slope portion onto the base substrate is located within a projection of the optical compensation portion onto the base substrate, and the optical compensation portion is configured to weaken or eliminate the phenomenon, of the waviness occurring in the display image, caused by the slope portion. Therefore, when the light-emitting layer emits light, the phenomenon of the waviness occurring in the display image may be weakened or eliminated, thereby improving the display quality.

It needs to be noted that the display apparatus in this embodiment may be any product or component having a display function, such as an electronic paper, a smart phone, a tablet computer, a television, a laptop computer, a digital photo frame, a navigator, or the like.

It needs to be noted that in the accompanying drawings, for illustration clarity, the sizes of the layers and regions may be exaggerated. Furthermore, it may be understood that when an element or layer is referred to as being "on" another element or layer, such element or layer may be directly on the another element or layer or there is an intermediate layer therebetween. Further, it is understood that when an element or layer is referred to as being "under" another element or layer, such element or layer may be directly under the another element or layer, or there are more than one intermediate elements or layers therebetween. In addition, it may also be understood that when a layer or element is referred to as being "between" two layers or two elements, such layer or element may be a sole layer between the two layers or two elements, or there may also be more than one intermediate layers or elements. Like reference signs in the descriptions indicate like elements.

In the present disclosure, the terms "first" and "second" are used only for the purpose of descriptions and shall not be understood as indicating or implying the relative importance. The term "multiple" refers to two or more than two, unless otherwise indicated clearly.

Those skilled in the art will easily come up with other implementations of the present disclosure after considering the specification and practicing the content disclosed herein. The present disclosure is intended to cover any variations, uses, or adaptive changes of the present disclosure. These variations, uses, or adaptive changes follow the general principles of the present disclosure and include common knowledge or conventional technical means in the technical art that are not disclosed in the present disclosure. The specification and embodiments are considered as exemplary only, with a true scope and spirit of the present disclosure being indicated by the following claims.

It should be understood that the present disclosure is not limited to the precise structure described above and shown in the accompanying drawings, and that various modifications and changes may be made without departing from the scope thereof. The scope of the present disclosure is limited only by the appended claims.

The invention claimed is:

1. A display substrate, comprising:

a base substrate;

a light-emitting layer, on the base substrate and in a display region of the display substrate;

an encapsulation layer, on the light-emitting layer, opposite the base substrate;

a touch control layer, on the encapsulation layer, opposite the base substrate;

a first organic layer, on the touch control layer, opposite the base substrate, covering at least a portion of an edge of the encapsulation layer, and outside a bending region in a non-display region of the display substrate;

a blocking portion, at at least one side of the display region, and at a side, away from the display region, of the edge of the encapsulation layer;

wherein the encapsulation layer comprises:

an organic encapsulation layer, on the light-emitting layer, opposite the base substrate, and in the display region; wherein the blocking portion is at a side, away from the display region, of an edge of the organic encapsulation layer; the organic encapsulation layer comprises a slope portion and the slope portion has a non-uniform thickness distribution;

wherein the touch control layer comprises a first metal layer, an insulation layer, and a second metal layer; the first metal layer is at a side, of the organic encapsulation layer, opposite the base substrate; the insulation layer is at a side, of the first metal layer, opposite the base substrate and covers the first metal layer; and the second metal layer is at a side, of the insulation layer, opposite the base substrate;

wherein the display substrate further comprises:

a second organic layer, between the touch control layer and the first organic layer, in the display region and the non-display region, and outside the bending region; wherein the second organic layer covers the second metal layer.

2. The display substrate of claim 1, wherein the blocking portion is at a side, away from the display region, of an edge of the first organic layer.

3. The display substrate of claim 1, wherein the blocking portion is outside the bending region and blocks the first organic layer from entering the bending region.

4. The display substrate of claim 1, wherein a height of the blocking portion is greater than a height of the first organic layer at an edge, of the first organic layer, away from the display region.

5. The display substrate of claim 1, wherein the first organic layer comprises an optical compensation portion; wherein an orthographic projection of the slope portion onto the base substrate is within an orthographic projection of the optical compensation portion onto the base substrate, and the optical compensation portion is configured to weaken or eliminate waviness, in a display image, caused by the slope portion.

6. The display substrate of claim 5, wherein at different positions in the display region, sums of thicknesses of the optical compensation portion and thicknesses of the slope portion are same, a refractive index of the slope portion is same as a refractive index of the optical compensation portion, and a surface, of the optical compensation portion, opposite the base substrate is parallel to a surface, of the base substrate, facing the light-emitting layer.

7. The display substrate of claim 5, wherein a material of the organic encapsulation layer is same as a material of the optical compensation portion.

8. The display substrate of claim 5, wherein the organic encapsulation layer further comprises a first planar portion in the display region and adjoining the slope portion; wherein the first planar portion has a uniform thickness; and the first organic layer further comprises a second planar portion in the display region and adjoining the optical compensation portion; wherein the second planar portion is at a side, of the first planar portion, opposite the base substrate; a surface, of the second planar portion, opposite the base substrate is parallel to the surface, of the base substrate, facing the light-emitting layer; a material of the second planar portion is same as a material of the optical compensation portion; at different positions in the display region, sums of thicknesses of the first organic layer and thicknesses of the organic encapsulation layer are same.

9. The display substrate of claim 5, wherein the first organic layer further comprises an edge portion, wherein the edge portion adjoins the optical compensation portion, the edge portion is in the non-display region, and outside the bending region.

10. The display substrate of claim 1, wherein the blocking portion is in at least one of the first metal layer, the insulation layer, the second metal layer, and the second organic layer.

11. The display substrate of claim 10, wherein when the blocking portion is in at least one of the first metal layer, the insulation layer, and the second organic layer, the second metal layer comprises a hollowed-out portion, a lapping portion, and a wiring portion; the lapping portion is at a side, of the hollowed-out portion, opposite the display region; the wiring portion is at a side, of the lapping portion, opposite the display region; an orthographic projection of the blocking portion onto the base substrate is within an orthographic projection of the hollowed-out portion onto the base substrate; the lapping portion contacts the first metal layer; and the wiring portion is connected to the lapping portion.

12. The display substrate of claim 1, wherein there are N blocking portions, wherein N is a positive integer; when N is greater than 1, the N blocking portions are sequentially arranged along a direction pointing from the display region to the non-display region.

13. The display substrate of claim 12, wherein N is greater than 1, and there is a gap between two adjacent blocking portions.

14. The display substrate of claim 12, wherein N is greater than 1, and the N blocking portions have a same height, or at least two of the N blocking portions have different heights.

15. The display substrate of claim 1, wherein a distance between the blocking portion and the bending region is less than a distance between the blocking portion and the display region.

16. The display substrate of claim 1, further comprising a dam, wherein the dam is in the non-display region, the dam is at a side, of the blocking portion, close to the display region, and the dam is not overlapped with the blocking portion along a direction perpendicular to the base substrate; and a distance between the blocking portion and the dam is less than a distance between the blocking portion and the bending region.

17. A display apparatus, comprising the display substrate of claim 1.

* * * * *